(12) United States Patent
Wang

(10) Patent No.: US 7,119,562 B2
(45) Date of Patent: Oct. 10, 2006

(54) CONTACT-TYPE FILM PROBE

(75) Inventor: Chih Yuan Wang, Shengang Township, Taichung County (TW)

(73) Assignee: Wintek Corporation, Taichung (TW)

( * ) Notice: Subject to any disclaimer, the term of this patent is extended or adjusted under 35 U.S.C. 154(b) by 0 days.

(21) Appl. No.: 11/030,912

(22) Filed: Jan. 10, 2005

(65) Prior Publication Data

US 2006/0152233 A1    Jul. 13, 2006

(51) Int. Cl.
*G01R 31/02* (2006.01)
(52) U.S. Cl. .................. 324/754; 324/761; 324/762
(58) Field of Classification Search ............. 702/118; 324/754–762; 29/874–887; 174/256, 258
See application file for complete search history.

(56) References Cited

U.S. PATENT DOCUMENTS

| | | | |
|---|---|---|---|
| 5,539,676 A * | 7/1996 | Yamaguchi | 702/118 |
| 6,046,599 A * | 4/2000 | Long et al. | 324/762 |
| 6,188,232 B1 * | 2/2001 | Akram et al. | 324/755 |
| 6,256,882 B1 * | 7/2001 | Gleason et al. | 29/874 |
| 6,853,205 B1 * | 2/2005 | Cheng et al. | 324/754 |

* cited by examiner

*Primary Examiner*—Vinh Nguyen
*Assistant Examiner*—Arleen M. Vazquez
(74) *Attorney, Agent, or Firm*—Rosenberg, Klein & Lee

(57) ABSTRACT

A contact-type film probe including a plastic substrate and multiple signal lines arranged on one face of the substrate. A contact conductive layer is disposed at one end of each signal line. A buffer layer is disposed between the contact conductive layer and the substrate. The other section of the signal line free from the contact conductive layer is coated with an insulating layer. By means of the buffer layer, when contacting with the wires of the liquid crystal display, the force is fully evenly exerted onto the contact conductive layers and the direct contact force exerted onto the contact conductive layers is reduced so as to prolong the using life of the contact-type film probe.

14 Claims, 4 Drawing Sheets

CONTACT-TYPE FILM PROBE

BACKGROUND OF THE INVENTION

The present invention is related to a film probe for testing liquid crystal display, and more particularly to a contact-type film probe in which a buffer layer is additionally disposed for providing a buffering effect and reducing the direct contact force exerted onto the contact conductive layers. Therefore, the using life of the contact-type film probe can be prolonged.

In a conventional contact-type soft film probe structure, multiple one-to-one straight film probes are directly made on a specific tool according to the wire layout of a liquid crystal display. The probes directly contact with the wires of the liquid crystal display. After contacted, the signal will be input via the probes to activate the liquid crystal display. According to the state of display, it can be judged whether the liquid crystal display is good or bad.

FIGS. 5 and 6 show a conventional contact-type soft film probe. Multiple signal lines 82 are arranged on one face of a plastic substrate 81 according to wire layout of a liquid crystal display. A contact conductive layer 83 is disposed at one end of each signal line 82 to form a probe. The other section of the signal line 82 free from the contact conductive layer 83 is coated with an insulating layer 84.

The thickness of each layer of the film probe is in the grade of micron so that the thickness of the film probe as a whole is still very thin. Accordingly, when contacting the film probe with the wire 91 of the liquid crystal display 9 as shown in FIG. 7, it is necessary to apply a pressure onto the probe, whereby the contact conductive layers 83 of the film probe can truly contact with the wires 91 of the liquid crystal display. However, the contact conductive layers 83 are generally made of copper foil material. Therefore, during contacting, the edges and corners of the wires 91 of the liquid crystal display tend to partially over-wear the contact conductive layers 83 and signal lines 82. This may cut off the contact conductive layers 83 and the signal lines 82. As a result, the signal cannot be normally transmitted to the wires of the liquid crystal display. This will make the liquid crystal display unable to display pictures or lead to poor display of the pictures. Accordingly, the test result of the liquid crystal display will be affected. Furthermore, in the case that the contact conductive layers 83 are worn out or cut off, the using life of the film probe will be shortened and the cost will be increased.

SUMMARY OF THE INVENTION

It is therefore a primary object of the present invention to provide a contact-type film probe in which a buffer layer is additionally disposed between the substrate and the contact conductive layer. The buffer layer provides a buffering effect. Accordingly, when contacting with the wires of the liquid crystal display, the force is fully evenly exerted onto the contact conductive layers and the direct contact force exerted onto the contact conductive layers is reduced so as to prolong the using life of the contact-type film probe.

According to the above object, the contact-type film probe of the present invention includes:

a plastic substrate, one face of the substrate being a connecting face;

multiple parallel signal lines side by side arranged on the connecting face of the substrate at intervals, each signal line having a connecting section near one end of the signal line;

at least one buffer layer disposed on the connecting face of the substrate and overlaid on the connecting section of the signal line;

multiple contact conductive layers respectively correspondingly connected with the signal lines, the buffer layer being sandwiched between the contact conductive layers and the substrate; and an insulating layer disposed on the other section of the signal line free from the contact conductive layer, whereby by means of the buffer layer, when contacting with the tested wires, the force is fully evenly exerted onto the contact conductive layers and the direct contact force exerted onto the contact conductive layers is reduced so as to prolong the using life of the contact-type film probe.

The present invention can be best understood through the following description and accompanying drawings wherein:

DETAILED DESCRIPTION OF THE PREFERRED EMBODIMENT

Figure 1:
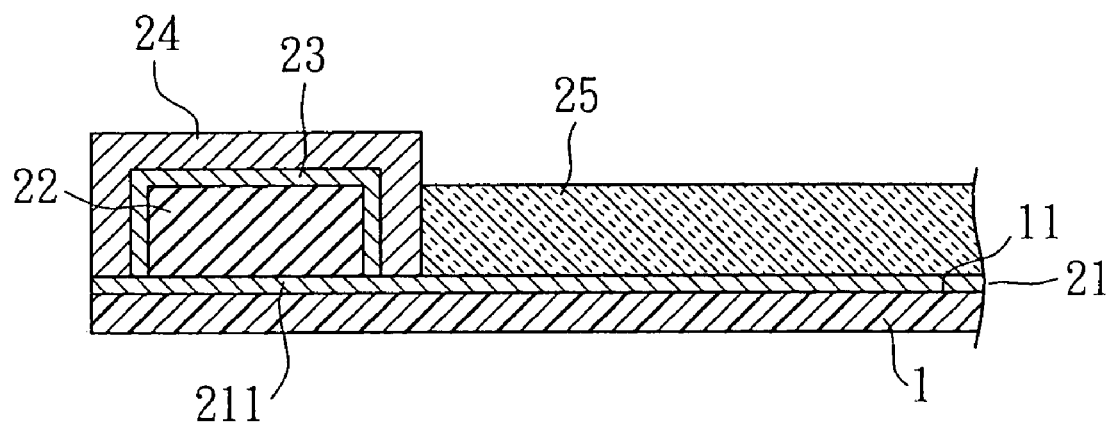
FIG. 1 is a sectional view showing the structure of the present invention.
Figure 2:
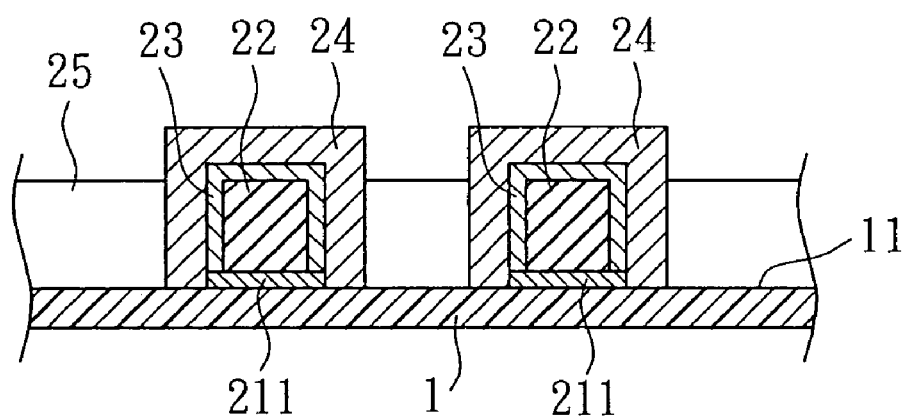
FIG. 2 is a sectional view in another direction, showing the structure of the present invention.

Please refer to FIGS. 1 and 2. The contact-type film probe of the present invention includes a plastic substrate 1. One face of the substrate 1 is a connecting face 11. Multiple parallel signal lines 21 are side by side arranged on the connecting face 11 of the substrate 1 at intervals. Each signal line 21 has a connecting section 211 near one end of the signal line 21. A buffer layer 22 is overlaid on one face of the connecting section 211 of the signal line 21 distal from the substrate 1. A conductive layer 23 and a contact conductive layer 24 are sequentially overlaid on the buffer layer 22. The conductive layer 23 and the contact conductive layer 24 wrap the surface of the buffer layer 22, which surface is not in contact with the signal line 21. In addition, the conductive layer 23 and the contact conductive layer 24 are connected with the signal line 21 along the outer periphery of the buffer layer 22. The other section of the signal line 21 free from the contact conductive layer 24 is coated with an insulating layer 25.

The substrate 1 is made of any of polyimide, PET, PC, PMMA and polysulfone. The signal line 21 is made of any of gold, silver, copper, nickel and aluminum. The buffer layer 22 is made of any of elastic plastic materials of epoxy, phenolic resin, PAC resin, acrylic resin, t-BOC resin, PHS resin, COMA resin and cyclic olefin resin.

The buffer layer 22 is made of any of the above elastic plastic materials with a thickness within 0.1 μm ~several hundred μm. When applying a pressure to make the contact conductive layer 24 contact with the wires of the liquid crystal display, the buffer layer 22 will bear the pressure and deform to provide a buffering effect. By means of the buffering effect, the force will be fully evenly exerted onto the contact conductive layer 24. Therefore, the contact conductive layer 24 will not be over-worn due to local direct greater contact force. Therefore, the using life of the contact-type film probe can be prolonged. In addition, the conductive layer 23 and the contact conductive layer 24 of the present invention are deposited on the buffer layer 22. The thickness of the coating of the conductive layer 23 and the contact conductive layer 24 is controlled within 0.1 μm~several hundred μm. Therefore, the conductive layer 23 and the contact conductive layer 24 have better flexural strength so that the sections of the conductive layer 23 and the contact conductive layer 24 connecting with the signal line 21 is not easy to damage or detach from the signal line 21.

Figure 3:
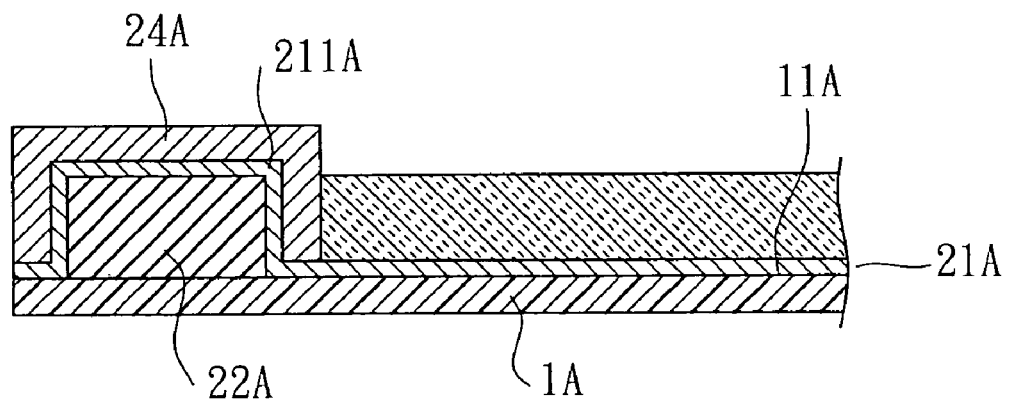
FIG. 3 is a sectional view showing the structure of a second embodiment of the present invention.

FIG. 3 shows a second embodiment of the present invention, in which the buffer layer 22A is directly disposed on the connecting face 11A of the substrate 1A. The signal line 21A is overlaid on the buffer layer 22A and the substrate 1A. The connecting section 211A of the signal line 21A is positioned on the top of the buffer layer 22A. The signal line 21A wraps the top face and the periphery of the buffer layer 22A to serve as the conductive layer 23 of the first embodiment. The contact conductive layer 24A is overlaid on the signal line 21A corresponding to the buffer layer 22A. The signal line 21A is integrally deposited on the substrate 1A and the buffer layer 22A so that the buffer layer 22A and the signal line 21A are very well bonded with each other. In addition, the signal line 21A as a whole has better structural strength. The buffer layer 22A of this embodiment can achieve the same effect as the first embodiment.

Figure 4:
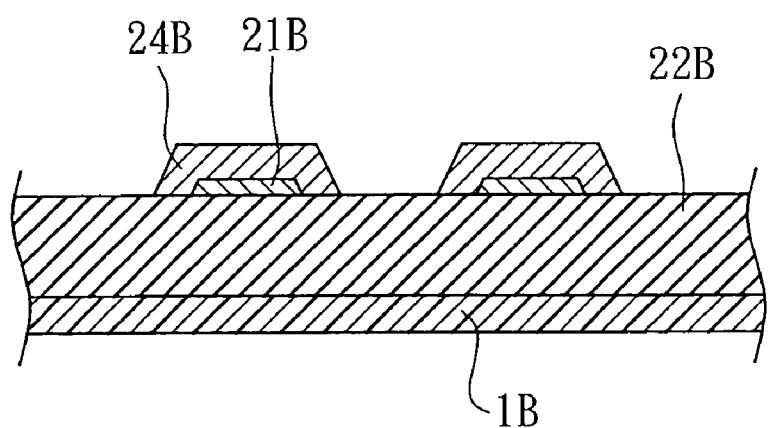
FIG. 4 is a sectional view showing the structure of a third embodiment of the present invention.
Figure 5:
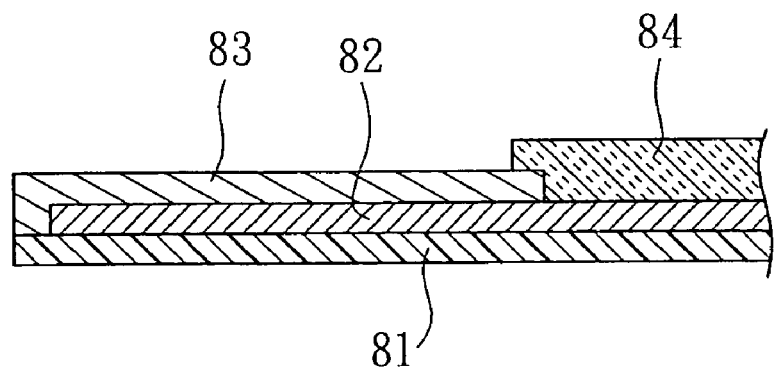
FIG. 5 is a sectional view showing the structure of a conventional contact-type soft film probe.
Figure 6:
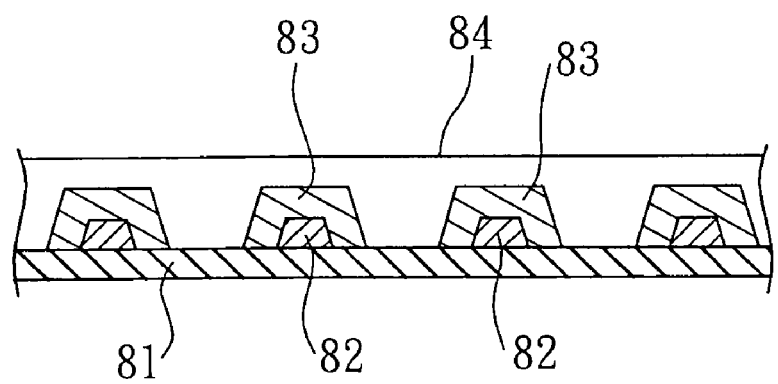
FIG. 6 is a sectional view in another direction, showing the structure of the conventional contact-type soft film probe.
Figure 7:
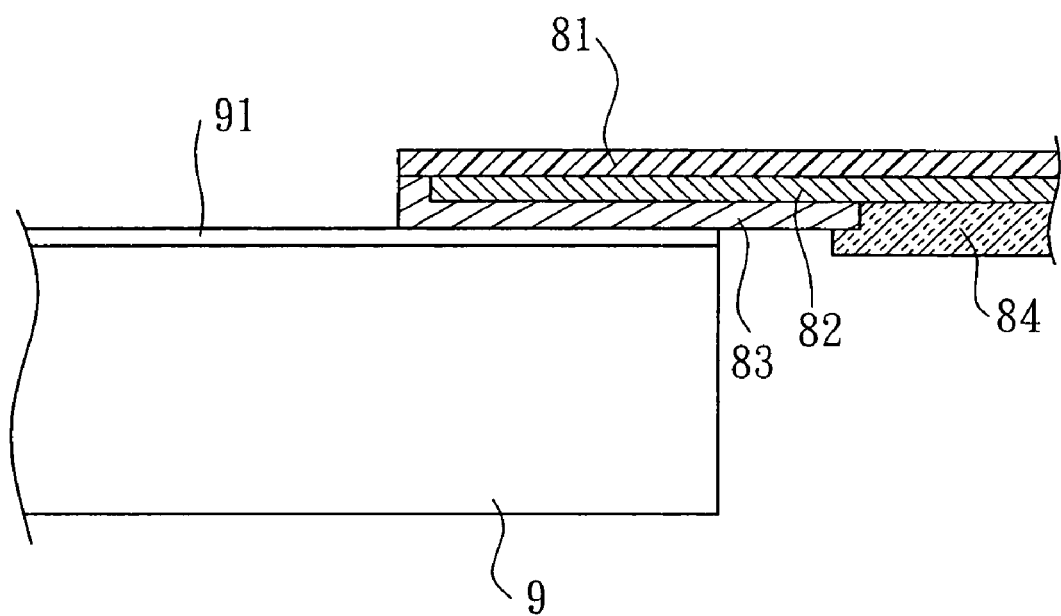
FIG. 7 is a sectional view showing the use of the conventional contact-type soft film probe.

FIG. 4 shows a third embodiment of the present invention, in which one single strip of buffer layer 22B is transversely disposed on the substrate 1B across lower sides of the signal lines 21B. The signal lines 21B and the contact conductive layers 24B are overlaid on the buffer layer 22B for achieving the same buffering effect as the first embodiment. Moreover, the buffer layer 22B is an integrated structure which can be easily disposed on the substrate 1B. For example, the buffer layer 22B can be formed on the substrate 1B by means of painting or etching. Such structure can reduce the error of allocation of optical mask and enhance the ratio of good products.

The above embodiments are only used to illustrate the present invention, not intended to limit the scope thereof. Many modifications of the above embodiments can be made without departing from the spirit of the present invention.

What is claimed is:

1. A contact-type film probe comprising:
   a plastic substrate, one face of the substrate being a connecting face;
   multiple parallel signal lines side by side arranged on the connecting face of the substrate at intervals, each signal line having a connecting section near one end of the signal line;
   at least one buffer layer disposed over the connecting face of the substrate and overlaid on the connecting section of the signal line;
   multiple contact conductive layers respectively correspondingly connected with the signal lines, at least one of the contact conductive layers forming a conductive element extending from at least one signal line, at least one of the contact conductive layers at least partially enveloping upper and side portions of the conductive element to capture against the buffer layer, the buffer layer resiliently supporting the contact conductive layers over the substrate; and
   an insulating layer disposed on the other section of the signal line free from the contact conductive layer, whereby by means of the buffer layer, when contacting with tested wires, the force is fully evenly exerted onto the contact conductive layers and the direct contact force exerted onto the contact conductive layers is reduced so as to prolong the using life of the contact-type film probe.

2. The contact-type film probe as claimed in claim 1, wherein the buffer layer is disposed between the connecting section of the signal line and the contact conductive layer.

3. The contact-type film probe as claimed in claim 1, wherein the buffer layer is a strip-like structure transversely disposed on the substrate across the signal lines.

4. The contact-type film probe as claimed in claim 1, wherein the substrate is made of any of polyimide, PET, PC, PMMA and polysulfone.

5. The contact-type film probe as claimed in claim 1, wherein the signal line is made of any of gold, silver, copper, nickel and aluminum.

6. The contact-type film probe as claimed in claim 1, wherein the buffer layer is made of any of elastic plastic materials of epoxy, polyimide, phenolic resin, PAC resin, acrylic resin, t-BOC resin, PHS resin, COMA resin and cyclic olefin resin.

7. A contact-type film probe comprising:
   a plastic substrate, one face of the substrate being a connecting face;
   multiple parallel signal lines side by side arranged on the connecting face of the substrate at intervals, each signal line having a connecting section near one end of the signal line;
   at least one buffer layer disposed over the connecting face of the substrate;
   at least one contact conductive layer connected to at least one of the signal lines, the contact conductive layer at least partially enveloping upper and side portions of a conductive element extending from at least one signal line to capture against the buffer layer, the buffer layer resiliently supporting the contact conductive layer over the substrate; and
   an insulating layer disposed on the other section of the signal line free from the contact conductive layer, whereby by means of the buffer layer, when contacting with tested wires, the force is fully evenly exerted onto the contact conductive layer and conductive element and the direct contact force exerted onto the contact conductive layer and conductive element is reduced so as to prolong the using life of the contact-type film probe.

8. The contact-type film probe as claimed in claim 7, wherein the buffer layer is disposed between the connecting section of the signal line and the substrate, the connecting section of the signal line being overlaid on the buffer layer and connected with the contact conductive layer.

9. The contact-type film probe as claimed in claim 7, wherein a conductive layer is further disposed between the buffer layer and the contact conductive layer.

10. The contact-type film probe as claimed in claim 7, wherein the buffer layer is disposed between the connecting section of the signal line and the contact conductive layer.

11. The contact-type film probe as claimed in claim 7, wherein the buffer layer is a strip-like structure transversely disposed on the substrate across the signal lines.

12. The contact-type film probe as claimed in claim 7, wherein the substrate is made of any of polyimide, PET, PC, PMMA and polysulfone.

13. The contact-type film probe as claimed in claim 7, wherein the signal line is made of any of gold, silver, copper, nickel and aluminum.

14. The contact-type film probe as claimed in claim 7, wherein the buffer layer is made of any of elastic plastic materials of epoxy, polyimide, phenolic resin, PAC resin, acrylic resin, t-BOC resin, PHS resin, COMA resin and cyclic olefin resin.

* * * * *